(12) United States Patent
Oyama

(10) Patent No.: US 6,813,070 B2
(45) Date of Patent: Nov. 2, 2004

(54) OPTICAL MEMBER FOR VACUUM ULTRAVIOLET, AND ALIGNER AND DEVICE MANUFACTURE METHOD USING SAME

(75) Inventor: Yasunao Oyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 52 days.

(21) Appl. No.: 09/794,354

(22) Filed: Feb. 28, 2001

(65) Prior Publication Data

US 2001/0053017 A1 Dec. 20, 2001

(30) Foreign Application Priority Data

Mar. 2, 2000 (JP) ........................................ 2000-056618

(51) Int. Cl.$^7$ ................................................ G02B 5/20
(52) U.S. Cl. ...................................... 359/361; 359/350
(58) Field of Search ............................ 252/588, 301.44; 359/361, 722, 796, 350

(56) References Cited

U.S. PATENT DOCUMENTS

| | | | | |
|---|---|---|---|---|
| 4,089,799 A | * | 5/1978 | Sommerdijk et al. | 252/301.4 H |
| 4,377,864 A | * | 3/1983 | McCollum et al. | 372/41 |
| 5,267,081 A | * | 11/1993 | Pein | 359/584 |
| 5,560,868 A | * | 10/1996 | Jordan et al. | 252/301.4 H |
| 6,061,174 A | * | 5/2000 | Shiozawa et al. | 359/361 |
| 6,472,087 B1 | | 10/2002 | Otani et al. | |

FOREIGN PATENT DOCUMENTS

| | | |
|---|---|---|
| EP | 0 667 541 | 8/1995 |
| EP | 0 869 203 | 7/1998 |
| EP | 0 995 820 | 4/2000 |
| JP | 09-315894 | 12/1997 |
| JP | 10-279378 | 10/1998 |
| JP | 10-330114 | 12/1998 |
| JP | 11-021197 | 1/1999 |
| JP | 11-228292 | 8/1999 |
| JP | 2000-191322 | 7/2000 |
| WO | WO 00/75697 | 12/2000 |

OTHER PUBLICATIONS

Antipin, A.A, Faraday effect and optical recording of EPR in crystals and glasses; Feb. 26, 1980. The Optical Society of America, 263–267.*

Mineralogy Database [online], [retrieved Sep. 20, 2002] Retrieved from the Mineralogy Database using Internet URL: http://www.webmineral.com/search.shtml.*

Darabont, et al., "Growth of Pure and Doped $KMgF_3$ Single Crystals", Journal of Crystal Growth, vol. 169, No. 1, pp. 89–93 (1996).

Kristianpoller, et al., "Irradiation Effects in Perovskite–Type Flourides", Radiation Effects, vol. 72, Nos. 1–4, pp. 201–208 (1983).

(List continued on next page.)

Primary Examiner—Drew A. Dunn
Assistant Examiner—Joshua L Pritchett
(74) Attorney, Agent, or Firm—Fitzpatrick, Cella, Harper & Scinto

(57) ABSTRACT

For realizing an optical member for vacuum ultraviolet with little absorption and with a low deliquescence nature and a low cleavage nature, a halide of an alkali metal such as Li, Na, Cs, or the like and a halide of any one of alkaline earth metals and other elements such as Ca, Sr, Ba, Mg, Zn, and the like are mixed in a ratio of 1:1, the mixture is sintered, and a fluoride crystal of $AMF_3$ type perovskite structure is grown. The crystal is processed to fabricate a substrate of an optical member such as a lens, a mirror, a prism, or the like for excimer lasers. Alternatively, the crystal is used as an evaporation source to coat a substrate of an optical member therewith. It is thus feasible to obtain optical members with little absorption in the vacuum ultraviolet region and with an excellent durability.

10 Claims, 6 Drawing Sheets

OTHER PUBLICATIONS

Baldochi, et al., "Growth and Optical Characteristics of Ce–doped and Ce:Na–codoped $BaLiF_3$ Single Crystals", Journal of Crystal Growth, vol. 200, No. 3–4, pp. 521–526 (1999).

Sakai, et al., "LiCaF Crystal as a New Vacuum Ultraviolet Optical Material with Transmission Down to 112 nm", Laser and Electro–Optics (The Pacific Rim Conference in Seoul), pp. 242–243 (1999).

* cited by examiner

OPTICAL MEMBER FOR VACUUM ULTRAVIOLET, AND ALIGNER AND DEVICE MANUFACTURE METHOD USING SAME

BACKGROUND OF THE INVENTION

1. Field of the Invention

The present invention relates to an optical member for vacuum ultraviolet used as an optical part (or component) in a light-source optical system, a projection optical system, etc. of an aligner for fabricating semiconductor devices such as microprocessors, memories, system LSIs, image sensors, light-emitting devices, display devices, and so on, and an aligner and a device manufacture method using the same.

2. Related Background Art

The excimer lasers are drawing attention as the only high-power laser that oscillate in the ultraviolet region and application thereof is expected in electronic industries, chemical industries, and energy industries. Specifically, they are utilized in the processing of metal, resin, glass, ceramics, semiconductors, and so on, in chemical reactions, etc. Recently, considerable progress has been made in their application as light sources of an aligner for ultra-fine lithography, taking advantage of their short wavelength property.

Currently dominating lithography steps are methods of transferring a pattern drawn on a mask, onto a wafer through lenses (photolithography). In general, the resolution of the transfer pattern increases in proportion to each of the numerical aperture (NA) of lenses and the inverse of the wavelength of light. However, the numerical aperture of lenses involves manufacturing problems, and it is thus effective to shorten the wavelength of the light in order to enhance the resolution. For this reason, the light sources for photolithography have been decreasing their wavelengths, e.g., from the g-line (436 nm) to the i-line (365 nm), and further to the KrF excimer laser (248 nm).

Particularly, the resolution of 0.23 µm has been achieved in a reduction projection aligner using the KrF excimer laser as a light source.

It has been considered heretofore that synthetic quartz glass (silica glass), which demonstrates little absorption and which can be polished in a large diameter, is suitable as an optical material for the lenses and others in an apparatus using as a light source the KrF excimer laser, or light of a shorter wavelength than it, particularly, light of a wavelength not more than 200 nm, i.e., light of the so-called vacuum ultraviolet region. As a crystal for such use, there have been proposed a lithium fluoride crystal, a magnesium fluoride crystal, and a calcium fluoride crystal (fluorite). For a general review, see for instance, Japanese Patent Application Laid-Open Nos. 10-279378, 11-021197, 9-315894, 10-330114, 11-228292, and 2000-191322.

However, according to the above prior art technologies, for example, the lithium fluoride crystal has an extreme deliquescence nature so as to be difficult to polish and is therefore not suitable for practical use. Further, the magnesium fluoride crystal is a biaxial crystal and has the property of optical anisotropy, thus causing the double refraction (birefringence) phenomenon. For this reason, the magnesium fluoride crystal can be used for polarizing elements such as polarizing prisms or the like utilizing the birefringence phenomenon or for optical members that do not have to have high imaging performance, such as window members for vacuum system, but is not an appropriate material for optical parts requiring high imaging performance, such as lenses, prisms, and the like used in the photolithography.

The calcium fluoride crystal (fluorite) is an excellent UV-transmissive material free from deliquescence nature and optical anisotropy, and has therefore been considered as a promising material that can be used for precision optical systems. However, the fluorite has a problem of a high cleavage nature.

The absorption of light becomes difficult with increase of the bandgap. The following equation is an energy reduction equation of a photon.

$$E(\text{eV}) = 1240/\lambda \text{ (nm)}$$

As seen from the equation, it is necessary to use a material with a wide bandgap of not less than 10 eV in order to prevent absorption at the wavelengths of not more than 120 nm in the vacuum ultraviolet region. Then, optimal crystals are those having the crystal structure of the cubic crystal system free from optical anisotropy. Although the melting point of the conventional fluorite is about 1400° C., preferred crystals for practical use are those having a melting point of not more than 1000° C.

SUMMARY OF THE INVENTION

A primary object of the present invention is to provide a high-quality optical member for vacuum ultraviolet, free from deliquescence nature and cleavage nature, with ease of processing and high practicality, and with little absorption, and also to provide an aligner and a device manufacture method using the optical member.

According to one aspect of the present invention, there is provided an optical member for vacuum ultraviolet comprising a substrate obtained by processing a crystal of $AMF_3$-type perovskite structure.

According to another aspect of the present invention, there is provided an optical member comprising a substrate and an $AMF_3$ coating obtained using a crystal of $AMF_3$-type perovskite structure as an evaporation source.

In one preferred embodiment, A is any one of Li, Na, and Cs and M is any one of Ca, Sr, Ba, Mg, and Zn.

In another preferred embodiment, A is K and M is Ba or Zn.

The inventor has discovered that when a single crystal of the $AMF_3$-type perovskite structure is grown from a 1:1 mixture of an alkali halide of LiF or the like and a compound of $MgF_2$, $CaF_2$, or the like, the crystal is an excellent optical material of the cubic crystal system free from optical anisotropy, with low birefringence, with little absorption in the vacuum ultraviolet region, and free from deliquescence nature and cleavage nature and can be used for the optical member of an aligner or the like.

Namely, by using an optical member such as a lens, a mirror, a prism, a window member, etc. comprising the substrate obtained by processing the above crystal, in a projection optical system or light-source optical system of an aligner using a light of the vacuum ultraviolet region as an illumination light, photolithography advanced in microprocessability can be implemented.

Further, in the present invention, evaporated particles generated using the crystal of the $AMF_3$-type perovskite structure as an evaporation source may be deposited on a surface of a lens, a mirror, a prism, a window member, or the like to form a coating comprised of an $AMP_3$ fluoride crystal.

DESCRIPTION OF THE PREFERRED EMBODIMENTS

Preferred embodiments of the present invention will be described with reference to the drawings.

A fluorine compound crystal of the $AMF_3$-type perovskite structure with a wide bandgap of about 10 eV and with an absorption edge of not more than 120 nm in the vacuum ultraviolet region is made by a known crystal growth method from a 1:1 mixture of a halide of an alkali metal (Li, Na, K, or Cs) and a halide of any one selected from alkaline earth metals and other elements (Ca, Sr, Ba, Mg, and Zn), and the crystal is processed into a substrate of an optical member for vacuum ultraviolet such as a lens, a prism, a mirror, or the like. Alternatively, by utilizing the crystal as an evaporation source or using the crystal, an $AMF_3$ film is deposited on the surface of the above optical member to form a coating.

Figure 1:
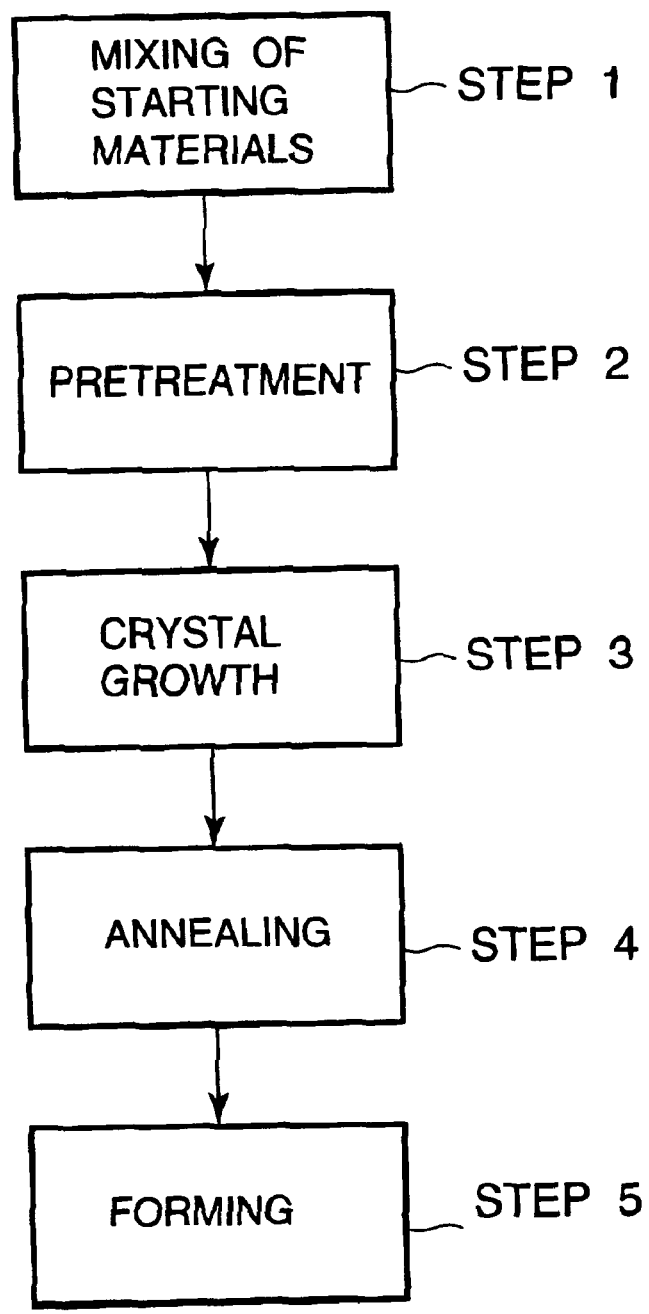
FIG. 1 is a flowchart showing the steps of fabricating an optical member for vacuum ultraviolet according to an embodiment of the present invention.

A flowchart of the fabrication steps of the above crystal is presented in FIG. 1.

Pretreatment Step

In step 1, starting materials are mixed together, and in step 2, a sintered body to be subjected to a single crystal production step is made. By this step, water contained in the starting materials is removed as much as possible.

Single Crystal Production Step

After the sintered body as treated in the above steps is set in a crucible-drop-type growth furnace and the crucible is heated to about 1000° C. to fuse the sintered body, the fused material is gradually cooled (step 3). In this slow cooling step, it is preferable to effect the slow cooling while dropping the crucible at the speed of 0.1 to 5.0 mm per hour.

Annealing Step

A single crystal thus grown is heat-treated in an annealing furnace in step 4. In this step, the crucible is heated to 900 to 1300° C. The heating time is not less than 20 hours and more preferably 20 to 30 hours.

In the single crystal obtained in this way, the oxygen content can be not more than 25 ppm, and the contents of unwanted impurities such as water, iron (Fe), nickel (Ni), chromium (Cr), etc. can be not more than 10 ppm, respectively.

The single crystal obtained by the above steps is measured for its transmittance to check the absorption edge and birefringence (distortion) and is then processed into the shape of a substrate for a lens or the like in step 5. Alternatively, the crystal obtained as described above is evaporated by use of an evaporation system and deposited on a surface of a substrate for a lens or the like to form a coating on the substrate.

Figure 2:
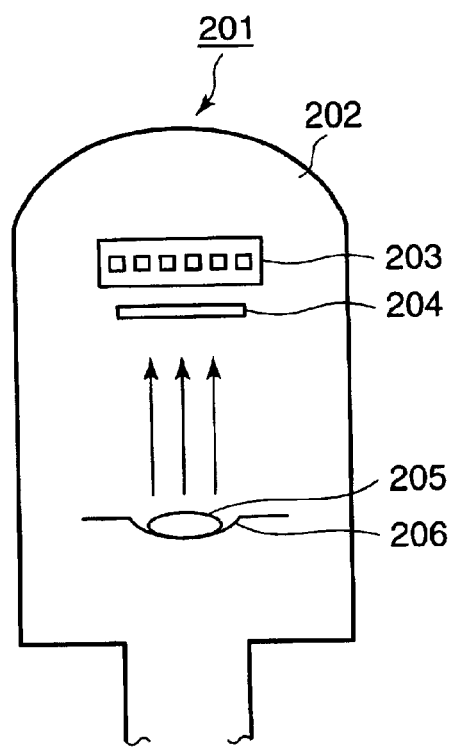
FIG. 2 is a schematic view showing a system for coating an optical member with a fluoride crystal.

FIG. 2 shows a method of coating an optical member such as a lens or the like with the above fluoride crystal. The fluoride crystal 205 of the $AMF_3$-type perovskite structure as an evaporation source is placed on an evaporation dish 206 in a vacuum chamber 202, and an optical member 204 to be coated is placed above it. The degree of vacuum inside the vacuum chamber 202 is regulated to about $1.33 \times 10^{-3}$ Pa (about $1 \times 10^{-5}$ Torr). Then, the evaporation dish 206 is heated to 700 to 1200° C. to evaporate the $AMF_3$ fluoride crystal 205, whereby a thin film of $AMF_3$ is formed on the surface of the optical member 204 heated at 100 to 200° C. by a substrate-heating heater 203. In this way the coating of the $AMF_3$ crystal is formed.

Figure 3:
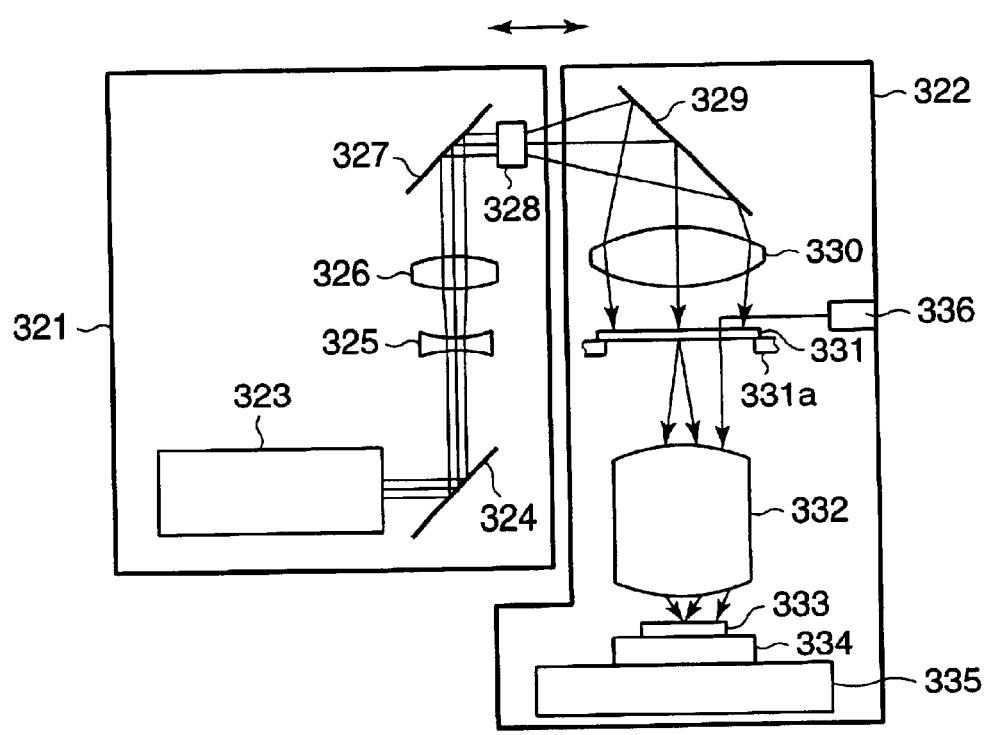
FIG. 3 is a schematic view illustrating an aligner.

FIG. 3 shows an aligner fabricated using an optical member the substrate which is comprised of the above fluoride crystal, or an optical member coated with the crystal. The aligner includes a reduction projection aligner using a lens optical system, a 1:1 projection aligner of lens type, and so on. A particularly desirable exposure system is a stepper employing the so-called step-and-repeat system in which after completion of exposure of one small area (field) of a wafer, the wafer is moved by one step to then expose an adjacent field, in order to implement the exposure of the entire surface of the wafer. The optical member of the above crystal can also be suitably applied to an aligner of the microscan system.

In FIG. 3, a light-source optical system 321 and an exposure section 322 are constructed separately and independently of each other. Namely, they are in a physically separate state.

The light-source optical system 321 has a light source 323, for example, a high-power large light source such as a KrF, ArF, or $F_2$ excimer laser source, a mirror 324, a concave lens 325, and a convex lens 326, and the concave lens 325 and convex lens 326 have the function as a beam expander to expand the beam diameter of the laser approximately into the size of an optical integrator 328.

A mirror 327 is disposed upstream of the optical integrator 328 for uniformly illuminating an area on a reticle 331, and the light-source optical system 321 is composed of the elements from the light source 323 to the optical integrator 328.

The exposure section has a mirror 329 and a condenser lens 330 to collimate the beam of light emerging from the optical integrator 328.

Below the condenser lens 330, there are the reticle 331 with a circuit pattern drawn therein, a reticle holder 331a for vacuum-holding the reticle 331, a projection optical system 332 for projecting the reticle pattern, a wafer 333 in which the reticle pattern is printed, and an XY stage 334. The XY stage 334 vacuum-holds the wafer 333 and moves in the X, Y directions during printing in the step-and-repeat system.

The exposure section 322 is composed of the elements from the mirror 329 as a part of the optical system to the XY stage 334 on a surface plate 335. Further, the aligner is provided with an alignment means 336 used for TTL alignment, an autofocus mechanism (not shown), a wafer transferring mechanism (not shown), and so on.

Figure 4:
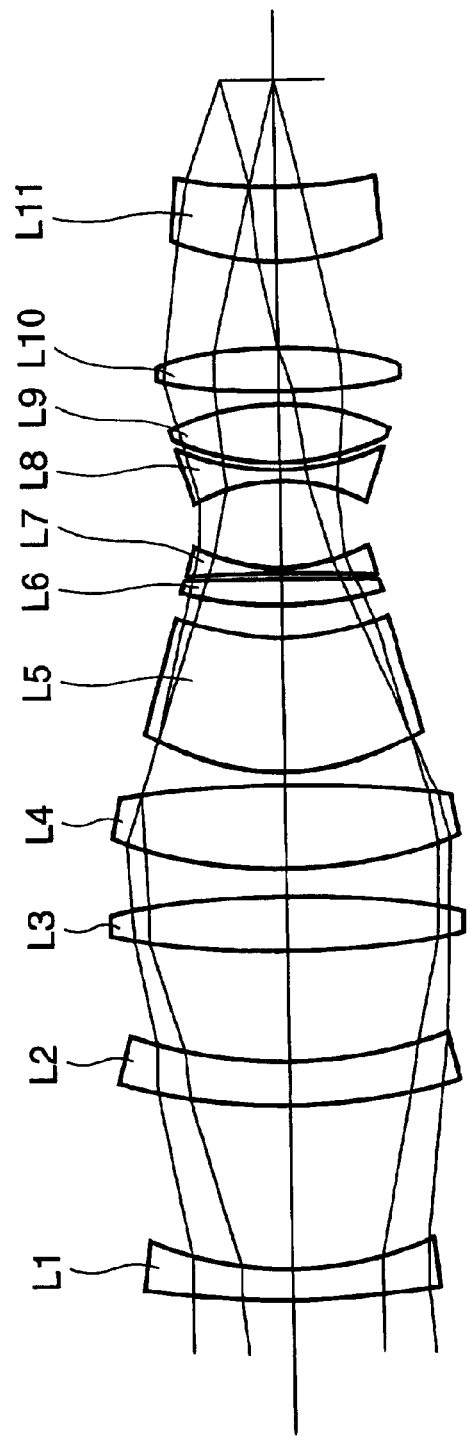
FIG. 4 is a schematic view showing a projection optical system of an aligner.

FIG. 4 shows the projection optical system of the aligner. This lens assembly is composed of a combination of eleven lenses L1 to L11 without bonding to each other.

The present embodiment uses the above fluoride crystal as a base material making the substrate of the lenses and mirrors illustrated in FIGS. 3 and 4, or as a coating material such as an antireflection film, a reflection enhancing film, or the like provided on the surfaces of these lenses and mirrors.

Figure 5A:
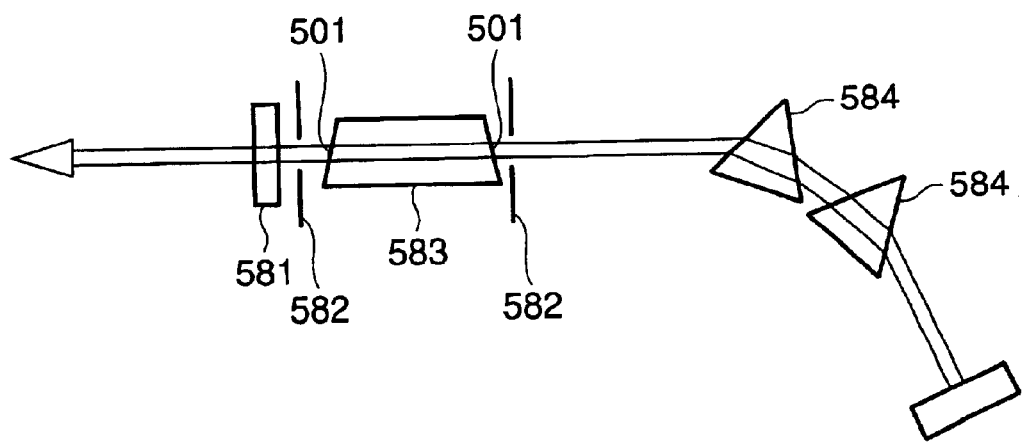
FIGS. 5A and 5B are schematic views each showing a laser oscillator as a light source of an aligner.
Figure 5B:
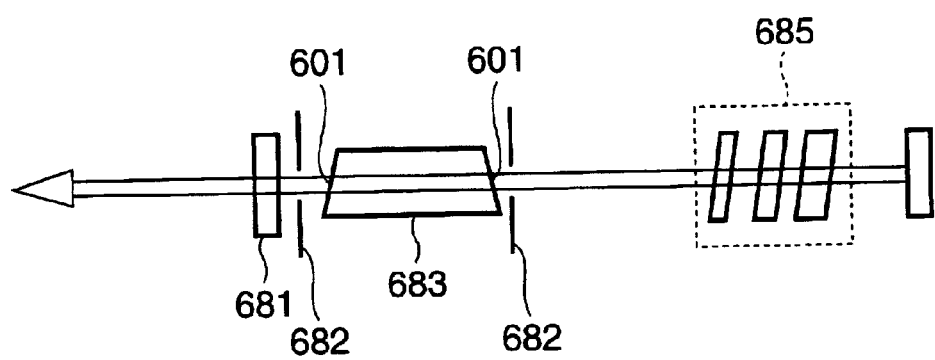

FIGS. 5A and 5B show configurations of excimer laser oscillators used as light sources of the above aligner. The excimer laser oscillator of FIG. 5A is a device for generating a laser such as the ArF excimer laser, $F_2$ excimer laser, or the like by emission and resonance, and is composed of a plasma tube 583 having two window members 501, diaphragm (or stopping) apertures 582 for stopping down the excimer laser emerging from the plasma tube 583, prisms 584 for converting the wavelength of the excimer laser to a shorter wavelength, and a reflector 581 for reflecting the excimer laser.

The excimer laser oscillator of FIG. 5B is composed of a plasma tube 683 having two window members 601, diaphragm apertures 682 for stopping down the excimer laser emerging from the plasma tube 683, an etalon 685 for converting the wavelength of the excimer laser into a shorter wavelength, and a reflector 681 for reflecting the excimer laser.

When the fluoride crystal according to the present embodiment is processed into the above prisms, window materials, etalon, etc. and is mounted in the excimer laser oscillator, the wavelength width of the excimer laser can be made narrower through the prisms, the etalon, or the like. In other words, the excimer laser can be converted into that with a shorter wavelength.

Semiconductor devices and the like advanced in microprocessability can readily be fabricated by transferring the reticle pattern onto the wafer using the aligner according to the present embodiment.

EXAMPLE 1

Lithium fluoride and calcium fluoride were mixed in a molar ratio of 1:1.

This mixture was put into a crucible of a refining furnace and heated to 900° C., and was then cooled and sintered to obtain a sintered body of $LiCaF_3$.

Then, the above sintered body was put into a crucible of a single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $LiCaF_3$ was put into the crucible to contact the mixture and then was drawn up at the rate of 1 mm/h. After that, a single crystal of $LiCaF_3$ thus grown was put into a crucible of an annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average birefringence of the thus obtained crystal were determined. The absorption edge was not more than 120 nm and the average of birefringence was about 20 nm/cm.

EXAMPLE 2

Lithium fluoride and strontium fluoride were mixed in a molar ratio of 1:1.

This mixture was put into the crucible of the refining furnace and heated to 900° C., and was then cooled and sintered to obtain a sintered body of $LiSrF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $LiSrF_3$ was put into the crucible to contact the mixture and then was drawn up at the rate of 1 mm/h. After that, a single crystal of $LiSrF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 3

Lithium fluoride and barium fluoride were mixed in a molar ratio of 1:1.

This mixture was put into the crucible of the refining furnace and heated to 900° C., and was then cooled and sintered to obtain a sintered body of $LiBaF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $LiBaF_3$ was put into the crucible to contact the mixture and then was drawn up at the rate of 1 mm/h. After that, a single crystal of $LiBaF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 4

Lithium fluoride and magnesium fluoride were mixed in a molar ratio of 1:1.

This mixture was put into the crucible of the refining furnace and heated to 900° C., and was then cooled and sintered to obtain a sintered body of $LiMgF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $LiMgF_3$ was put into the crucible to contact the mixture and then was drawn up at the rate of 1 mm/h. After that, a single crystal of $LiMgF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 5

Lithium fluoride and zinc fluoride were mixed in a molar ratio of 1:1.

This mixture was put into the crucible of the refining furnace and heated to 900° C., and was then cooled and sintered to obtain a sintered body of $LiZnF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $LiZnF_3$ was put into the crucible to contact the mixture and then was drawn up at the rate of 1 mm/h. After that, a single crystal of $LiZnF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 6

Sodium fluoride and calcium fluoride were mixed in a molar ratio of 1:1.

This mixture was put into the crucible of the refining furnace and heated to 900° C., and was then cooled and sintered to obtain a sintered body of $NaCaF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $NaCaF_3$ was put into the crucible to contact the mixture and then was drawn up at the rate of 1 mm/h. After that, a single crystal of $NaCaF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 7

Sodium fluoride and strontium fluoride were mixed in a molar ratio of 1:1.

This mixture was put into the crucible of the refining furnace and heated to 900° C., and was then cooled and sintered to obtain a sintered body of $NaSrF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $NaSrF_3$ was put into the crucible to contact the mixture and then was drawn up at the rate of 1 mm/h. After that, a single crystal of $NaSrF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 8

Sodium fluoride and barium fluoride were mixed in a molar ratio of 1:1.

This mixture was put into the crucible of the refining furnace and heated to 900° C., and was then cooled and sintered to obtain a sintered body of $NaBaF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $NaBaF_3$ was put into the crucible to contact the mixture and then was drawn up at the rate of 1 mm/h. After that, a single crystal of $NaBaF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 9

Sodium fluoride and magnesium fluoride were mixed in a molar ratio of 1:1.

This mixture was put into the crucible of the refining furnace and heated to 900° C., and was then cooled and sintered to obtain a sintered body of $NaMgF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $NaMgF_3$ was put into the crucible to contact the mixture and then was drawn up at the rate of 1 mm/h. After that, a single crystal of $NaMgF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 10

Sodium fluoride and zinc fluoride were mixed in a molar ratio of 1:1.

This mixture was put into the crucible of the refining furnace and heated to 900° C., and was then cooled and sintered to obtain a sintered body of $NaZnF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $NaZnF_3$ was put into the crucible to contact the mixture and then was drawn up at the rate of 1 mm/h. After that, a single crystal of $NaZnF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 11

Cesium fluoride and calcium fluoride were mixed in a molar ratio of 1:1.

This mixture was put into the crucible of the refining furnace and heated to 900° C., and was then cooled and sintered to obtain a sintered body of $CsCaF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $CsCaF_3$ was put into the crucible to contact the mixture and then was drawn up at the rate of 1 mm/h. After that, a single crystal of $CsCaF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 12

Cesium fluoride and strontium fluoride were mixed in a molar ratio of 1:1.

This mixture was put into the crucible of the refining furnace and heated to 900° C., and was then cooled and sintered to obtain a sintered body of $CsSrF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $CsSrF_3$ was put into the crucible to contact the mixture and then was drawn up at the rate of 1 mm/h. After that, a single crystal of $CsSrF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 13

Cesium fluoride and barium fluoride were mixed in a molar ratio of 1:1.

This mixture was put into the crucible of the refining furnace and heated to 900° C., and was then cooled and sintered to obtain a sintered body of $CsBaF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $CsBaF_3$ was put into the crucible to contact the mixture and then was drawn up at the rate of 1 mm/h. After that, a single crystal of $CsBaF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 14

Cesium fluoride and magnesium fluoride were mixed in a molar ratio of 1:1.

This mixture was put into the crucible of the refining furnace and heated to 900° C., and was then cooled and sintered to obtain a sintered body of $CsMgF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $CSMgF_3$ was put into the crucible to contact the mixture and then was drawn up at the rate of 1 mm/h. After that, a single crystal of $CsMgF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 15

Cesium fluoride and zinc fluoride were mixed in a molar ratio of 1:1.

This mixture was put into the crucible of the refining furnace and heated to 900° C., and was then cooled and sintered to obtain a sintered body of $CsZnF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $CsZnF_3$ was put into the crucible to contact the mixture and then was drawn up at the rate of 1 mm/h. After that, a single crystal of $CsZnF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 16

Potassium fluoride and barium fluoride were mixed in a molar ratio of 1:1.

This mixture was put into the crucible of the refining furnace and heated to 900° C., and was then cooled and sintered to obtain a sintered body of $KBaF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $KBaF_3$ was put into the crucible to contact the mixture and then was drawn up at the rate of 1 mm/h. After that, a single crystal of $KBaF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

EXAMPLE 17

Potassium fluoride and zinc fluoride were mixed in a molar ratio of 1:1.

This mixture was put into the crucible of the refining furnace and heated to 900° C., and was then cooled and sintered to obtain a sintered body of $KZnF_3$.

Then, the above sintered body was put into the crucible of the single-crystal growth furnace. The interior of the furnace was maintained in the vacuum of $7.98 \times 10^{-2}$ Pa (about $6 \times 10^{-4}$ Torr) and the temperature was raised from room temperature to 1000° C. Then, the furnace was maintained in the vacuum of $2.66 \times 10^{-4}$ Pa (about $2 \times 10^{-6}$ Torr) and at the temperature of 1000° C. for eleven hours.

Then, a seed crystal of $KZnF_3$ was put into the crucible to contact the mixture and then was drawn up at the rate of 1 mm/h. After that, a single crystal of $KZnF_3$ thus grown was put into the crucible of the annealing furnace and the interior of the furnace was evacuated. Then, the temperature of the crucible was raised at the rate of 100° C./h from room temperature to 800° C. and thereafter maintained at 800° C. for twenty hours. Then, the crucible was slowly cooled down at the rate of 6° C./h to room temperature. This work was repeatedly carried out five times.

Then, the absorption edge in the vacuum ultraviolet region and an average of birefringence of the thus obtained crystal were determined. The absorption edge was not more than 120 nm and the average of birefringence was about 20 nm/cm.

The optical materials for vacuum ultraviolet comprised of the above fluoride crystals all are optical materials with a low deliquescence nature and a low cleavage nature, with a high durability even under repetitive irradiation with a high energy light, with an absorption edge of not more than 120 nm in the vacuum ultraviolet region, and with a low birefringence (distortion). Therefore, an aligner with a high transfer accuracy and with an excellent durability can be realized by using the materials as substrates or coating materials of optical members for excimer lasers, particularly, lenses and others of a light-source optical system or projection optical system in an aligner for photolithography using the ArF or $F_2$ excimer laser, or by using the materials as an evaporation source as a raw material for the coating material.

Figure 6:
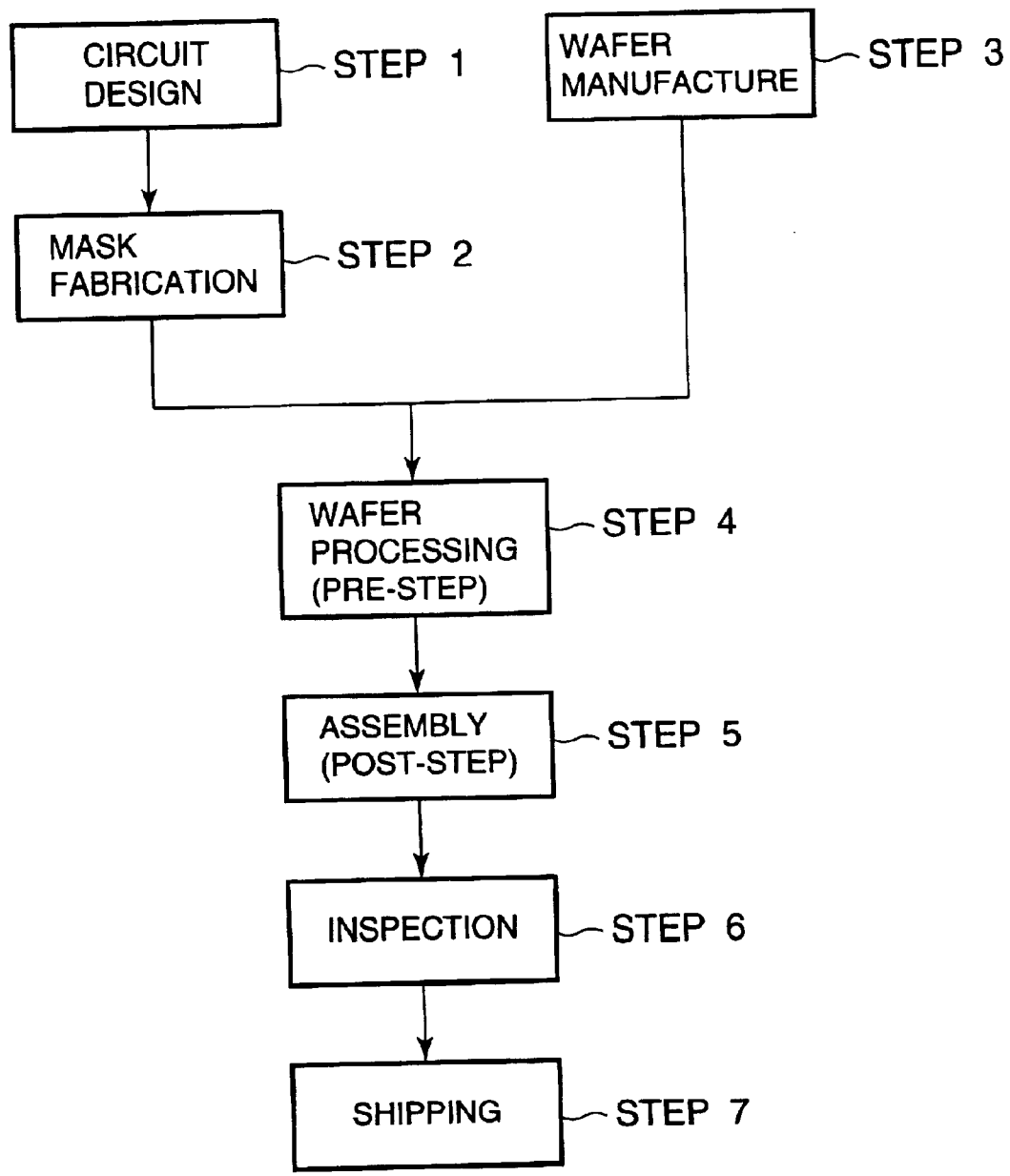
FIG. 6 is a flowchart showing the manufacturing steps of a semiconductor device.

An embodiment of the device manufacture method with the above aligner will be described below. FIG. 6 shows the manufacturing flow of semiconductor devices (semiconductor chips such as ICs, LSIs, or the like, or liquid crystal panels, CCDs, and so on). Step 1 (circuit design) is a step of designing a circuit of a semiconductor device. Step 2 (mask fabrication) is a step of fabricating a mask as a plate in which a circuit pattern designed is formed. Step 3 (wafer manufacture) is a step of manufacturing a wafer using a material of silicon or the like. Step 4 (wafer processing) is a step called the pre-step in which an actual circuit is formed on the wafer by the lithography technology with the aligner, using the mask and wafer prepared as described above. Step 5 (assembly) is a step called the post-step to fabricate semiconductor chips from the wafer as fabricated in step 4, which includes steps such as an assembly step (dicing, bonding), a packaging step (chip encapsulation), and so on. Step 6 (inspection) is a step of carrying out inspections including an operation check test, a durability test, and so on of the semiconductor devices fabricated in step 5. The semiconductor devices are completed through these steps and then shipped (step 7).

Figure 7:
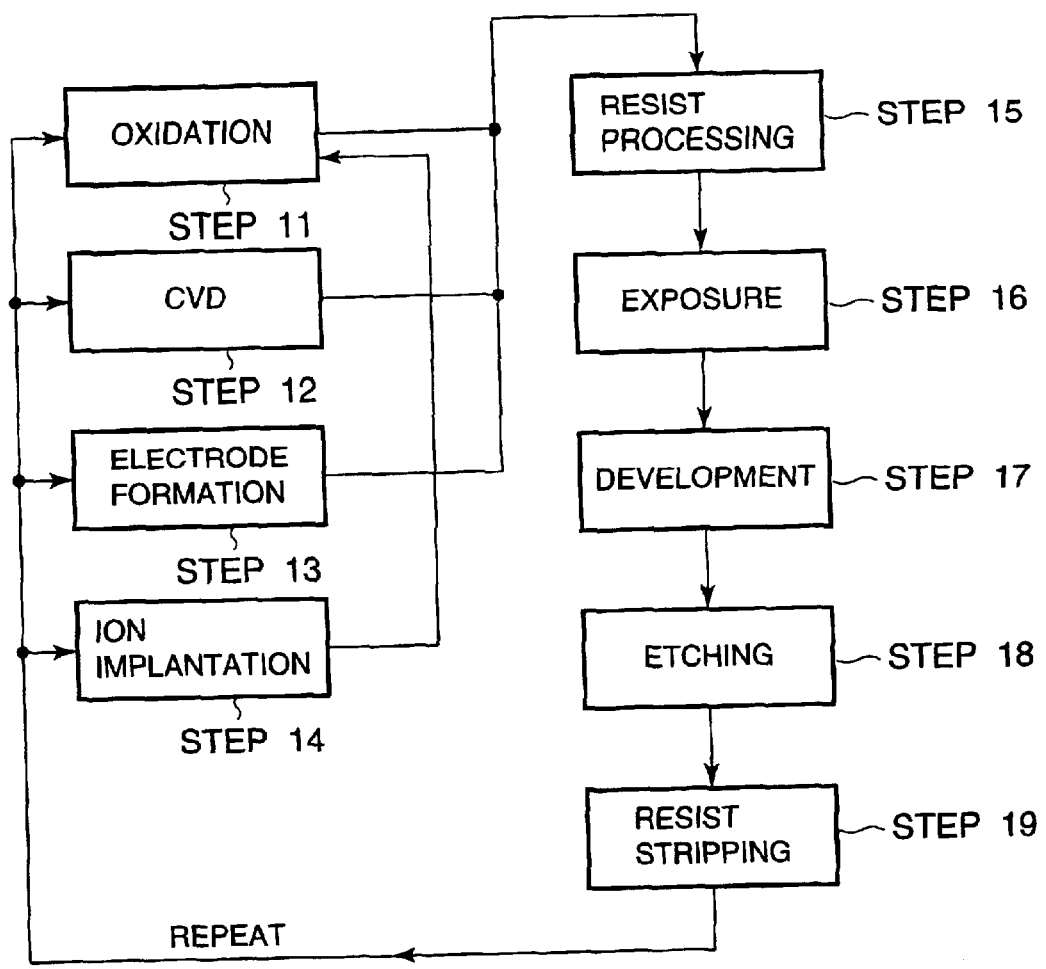
FIG. 7 is a flowchart showing wafer processing.

FIG. 7 shows the detailed flow of the above wafer processing. Step 11 (oxidation) is a step of oxidizing the surface of the wafer. Step 12 (CVD) is a step of forming an insulating film on the wafer surface, and optionally planarizing the surface by chemical mechanical polishing (CMP). Step 13 (electrode formation) is a step of forming electrodes on the wafer by evaporation, CVD, sputtering, plating, or the like and optionally planarizing the surface by CMP. Step 14 (ion implantation) is a step of implanting ions into the wafer. Step 15 (resist processing) is a step of applying a photosensitive material onto the wafer. Step 16 (exposure) is a step of printing the circuit pattern of the mask onto the wafer by the above-described aligner. Step 17 (development) is a step of developing the wafer as exposed. Step 18 (etching) is a step of removing the portions other than the developed resist image portion. Step 19 (resist stripping) is a step of removing the resist that has become unnecessary after the etching. The circuit pattern is formed in a multilayer structure on the wafer by repeatedly carrying out the steps. Using the manufacture method of the present embodiment makes it possible to manufacture highly integrated semiconductor devices which have been difficult to realize heretofore.

The present invention having the above described constitution provides the effects as described below.

When the $AMF_3$-type fluoride crystal with a low deliquescence nature and a low cleavage nature and with an excellent durability is used for a substrate of a lens or the like, it becomes feasible to realize a high-quality optical member for vacuum ultraviolet with little absorption in the vacuum ultraviolet region, with a low birefringence, and with an excellent durability.

When the above fluoride crystal is used as a coating material for optical parts such as a lens, a prism, a mirror, or the like, it is possible to reduce the absorption in the vacuum ultraviolet region and to improve the durability and the like.

What is claimed is:

1. An optical member for vacuum ultraviolet light comprising a crystal having a formula of $LiCaF_3$ and a perovskite structure, wherein an absorption edge of transmittance is not more than 120 nm.

2. The optical member for vacuum ultraviolet light according to claim 1, which is a lens, a prism, a half mirror or a window member.

3. An aligner comprising an optical system comprising the optical member for vacuum ultraviolet light as set forth in claim 1.

4. An aligner comprising a projection or light-source optical system comprising the optical member for vacuum ultraviolet light as set forth in claim 1.

5. A device manufacture method comprising the step of exposing a wafer by the aligner as set forth in claim 3.

6. An optical member for vacuum ultraviolet light comprising a crystal having a formula of $LiCaF_3$ and a perovskite structure as a main component,
    wherein an absorption edge of transmittance is not more than 120 nm.

7. The optical member for vacuum ultraviolet light according to claim 6, which is a lens, a prism, a half mirror or a window member.

8. An aligner comprising an optical system comprising the optical member for vacuum ultraviolet light as set forth in claim 6.

9. A device manufacture method comprising the step of exposing a wafer by the aligner as set forth in claim 8.

10. An aligner comprising a projection or light source optical system comprising the optical member for vacuum ultraviolet light as set forth in claim 6.

* * * * *